SEMICONDUCTOR DEVICES

Filed April 20, 1962

Inventors
FRITZ G. ADAM
BERNARD D. MILLS
By Percy P. Lantzy
Attorney

United States Patent Office 3,244,555
Patented Apr. 5, 1966

3,244,555
SEMICONDUCTOR DEVICES

Fritz Gunter Adam and Bernard Douglas Mills, London, England, assignors to International Standard Electric Corporation, New York, N.Y., a corporation of Delaware Filed Apr. 20, 1962, Ser. No. 189,063
Claims priority, application Great Britain, May 5, 1961, 16,416/61
14 Claims. (Cl. 117—212)

Figures 1A, 1B, 1C, 1D, 1E, 1F, 2:
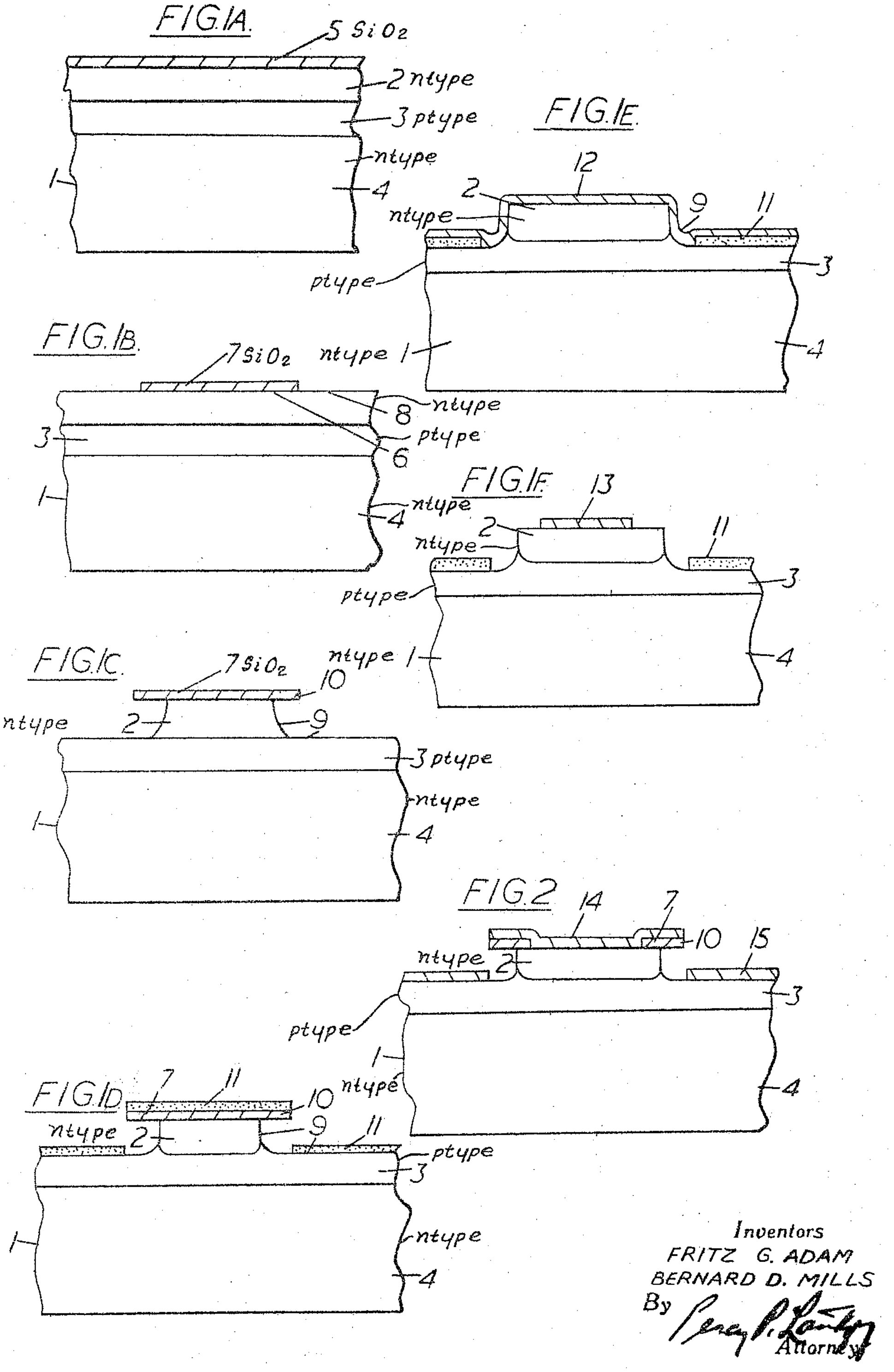

The present invention relates to semiconductor devices.

In making semiconductor devices it is often desirable to be able to produce small regions of one conductivity type of semiconductor material on a body of the opposite conductivity type, or ohmic contacts a short distance away from a junction between two regions of opposite conductivity type material. This problem is most acute if the device is intended for use at very high frequencies, where accurately controlled areas, and spacings of less than 20 microns, may be required. It is especially important if a large number of similar semiconductor devices are being made on one body of semiconductor material.

The present invention provides a method of making a semiconductor device comprising treating one surface of a body of semiconductor material such that a first area of the said surface is covered by an oxide layer and a second area is not covered by an oxide layer, etching away a part of the said second area and an an adjacent part of the said first area to produce a freshly exposed area of the said body, and depositing a film of an electrically conductive material on the said body in such manner that deposition on part of the said freshly exposed area is prevented by the said oxide layer.

Examples of methods according to the present invention will now be described with reference to the accompanying drawings in which:

FIGS. 1A–1F show stages in the manufacture of a semiconductor device by a method according to the present invention; and FIG. 2 shows one stage in a further method according to the present invention.

The semiconductor devices made by the methods illustrated in FIGS. 1A–1F and FIG. 2 are silicon transistors having low values of base resistance $r_b'$, and high values of power gain at V.H.F. frequencies. The low base resistance is obtained by making the spacing between the ohmic contact to the base region and the junction between the emitter and base regions very small, i.e. approximately 3 microns.

At the stage in the manufacture of a device illustrated in FIG. 1A one surface of a body 1 of silicon consists of a region 2 of n-type conductivity material, beneath which is a region 3 of p-type conductivity and a further region 4 of n-type conductivity. An oxide layer 5 of silicon dioxide covers the whole area of the one surface of the body 1.

This structure is obtained by diffusing gallium into one surface of a body of n-type conductivity silicon, in sufficient quantity to convert a part of the body to p-type conductivity material. The remainder of the body remains as the further region 4 of FIG. 1A. Phosphorus is then diffused into the same surface of the body, to a smaller depth than that penetrated by the gallium but in such an amount as to produce the region 2 of n-type conductivity shown in FIG. 1A. The region 3 of p-type conductivity then remains between region 2 and further region 4. Finally, the oxide layer 5, of 0.5 microns thickness, is formed by heating the body 1 in wet oxygen.

The next stage in the manufacture of the device is the removal of the oxide layer 5 from certain areas of the surface of body 1 by means of a photolithographic process. This process involves coating the oxide layer 5 with a light sensitive glue and then shining ultra-violet light through a mask on to a selected area of the glue. The ultra-violet light increases the resistance of the unmasked area of the glue to the action of a developer, which is then used to remove the masked area. In this way parts of the oxide layer 5 are uncovered and can then be removed by etching with hydrofluoric acid, the remainder of the layer being protected by the glue. The remaining glue is removed by a suitable solvent, leaving the structure illustrated in FIG. 1B.

In this figure a first area 6 of the surface of body 1 is covered by an oxide layer 7 whilst second areas 8 are not covered by oxide.

The body 1 is now subjected to the action of an etch containing a mixture of hydrofluoric acid, nitric acid and acetic acid, which dissolves silicon much more rapidly than its oxide, silicon dioxide. Therefore the oxide layer 7 is largely unaffected by the etch whilst exposed parts of the region 2 are quickly dissolved away, the etching process being continued until silicon has been removed to a depth just greater than the thickness of region 2. At the same time, as soon as a thin surface layer of region 2 has been removed from second areas 8 the etch is able to come into contact with the adjacent parts of first area 6, and these adjacent parts are also etched away. There remains at the end of the etching process the structure shown in FIG. 1C, in which a freshly exposed area 9 of body 1 extends a short distance underneath an overhanging portion 10 of the oxide layer 7.

Gallium is now diffused into the freshly exposed area 9 to give a low resistance surface layer, which contributes towards the low base resistance of the finished device. At the same time some gallium also passes through the oxide layer 7 and into the region 2, but it is arranged that the amount doing so is small compared with the amount of phosphorus already present.

The body 1 is next placed in an evacuated chamber containing a supply of an alloy of gold and gallium and the latter heated to a temperature above its melting point and evaporated on to the body 1. Care is taken that the evaporating atoms travel in a direction at right angles to the plane of the oxide layer 7 of FIG. 1C, and the resulting structure is as shown in FIG. 1D. The whole of the oxide layer 7 and the whole of the freshly exposed surface 9, apart from that shielded by the overhanging portion 10, is covered by a film 11 of the alloy of gold and gallium.

The oxide layer 7, together with that part of the film 11 on top of it, is next removed by etching in hydrofluoric acid and the body 1 again placed in an evacuated chamber for a further evaporation process. This time an aluminum film 12, FIG. 1E, is deposited on top of region 2, on the remainder of the freshly exposed area 9, and on the film 11 of the alloy of gold and gallium.

Those parts of the aluminum film 12 which are situated on the film 11 of the alloy of gold and gallium, the freshly exposed area 9, and the outer parts of region 2 are then removed by a similar photographic process to that described above in connection with the removal of the oxide layer from the second areas 8 of FIG. 1B. At the end of the process there remains a small, central portion 13 of aluminum (see FIG. 1F).

The remaining stages in the manufacture of the transistor consist in heating the body 1 to alloy the small, central portion 13 into the region 2, thus forming the emitter contact of the device. Film 11 of FIG. 1F forms the base contact and is situated at a distance from the p-n junction between the emitter region (region 2) and the base region (region 3) that is largely determined by the dimensions of the overhanging portion 10 of FIGS. 1C and 1D. This distance is approximately 3 microns.

A further example of a method according to the invention involves the same stages as those described above with reference to FIGS. 1A–1C. At this point, however, that part of the oxide layer 7 on the central portion of region 2 is removed by means of a photographic process similar to that described above. A film of aluminum, having portions designated 14 and 15 in FIG. 2, is then deposited on the exposed central portion of region 2, on the remainder of the oxide layer 7, and on those parts of the freshly exposed areas 9 that are not shielded by the overhanging portion 10. And, finally, the body 1 is heated to alloy in the film 14–15.

In this case the base contact of the device is portion 15 of the film of aluminum, which is separated from the p-n junction between regions 2 and 3 by a distance determined largely by the dimensions of the overhanging portion 10 of FIG. 1C.

In both of the above examples one transistor only was made on a body 1 of silicon. However, it will be appreciated that a plurality of similar devices can be made at the same time on the same body, the devices being separated from one another at the end of the stages in manufacture described above.

It is to be understood that the foregoing description of specific examples of this invention is not to be considered as a limitation on its scope.

What we claim is:

1. A method of making a semiconductor device having two regions of opposite conductivity type material comprising treating one surface of a first of said regions of semiconductor material of one conductivity type such that a first area of the said one surface is covered by an oxide layer and a second area is not covered by an oxide layer, etching away a part of the said second area to expose a second of said regions of opposite conductivity type and an adjacent part of the said first area extending below said oxide layer so that said oxide layer overhangs a portion of said adjacent etched area, depositing a film of an electrically conductive material on said first and second regions in such manner that deposition on the portion of said adjacent etched area is prevented by the said overhanging oxide layer to form a predetermined separation between said first region and the conductive material on said second region.

2. A method according to claim 1 in which the treating of the said one surface comprises oxidising both the said first and second areas and then removing the oxide from the said second area.

3. A method according to claim 2 including coating the oxide on the said first and second areas with a light-sensitive glue, exposing the glue over the oxide on the said first area to ultra-violet light, removing the glue over the oxide on the said second area by a developer, and etching away the oxide on the said second area.

4. A method according to claim 1 in which the said film of an electrically conductive material is deposited on the said regions by evaporation, the evaporating atoms travelling in a direction at right angles to the said oxide layer to prevent deposition on said adjacent area below said overhang.

5. A method according to claim 1 in which after the deposition of the said film of electrically conductive material the said oxide layer is removed by etching and a further electrically conductive material is deposited on said regions and then removed except for a portion on said first region.

6. A method according to claim 5 in which the said electrically conductive material is gold containing gallium.

7. A method according to claim 1 in which before the deposition of the said film of electrically conductive material a central portion of the said oxide layer is removed from the said first area.

8. A method according to claim 5 in which the said further electrically conductive material is aluminium.

9. A method according to claim 1 in which the said semiconductor material is silicon.

10. A method according to claim 9 in which the said first region is of n-type conductivity material, the said second region is of p-type conductivity and includes a further region of n-type conductivity material.

11. A method according to claim 1 in which the said part of the said second area and the said adjacent part of the said first area are removed by etching with a mixture of hydrofluoric acid, nitric acid and acetic acid.

12. A method according to claim 10 in which the said region of p-type conductivity is made by diffusing gallium into the said body.

13. A method according to claim 12 in which the said region of n-type conductivity is made by diffusing phosphorus into the said body.

14. A method according to claim 13 in which a plurality of the said first areas and a plurality of the said second areas are produced on one surface of a body of semiconductor material.

References Cited by the Examiner

UNITED STATES PATENTS

| | | | |
|---|---|---|---|
| 2,861,909 | 11/1958 | Ellis | 148—33 |
| 2,882,195 | 4/1959 | Wernick | 148—33 |
| 2,995,473 | 8/1961 | Levi. | |
| 3,012,921 | 12/1961 | Vaughan | 156—17 |
| 3,024,148 | 3/1962 | Schaer | 156—17 |
| 3,064,167 | 11/1962 | Hoerni. | |
| 3,079,254 | 2/1963 | Rowe. | |

FOREIGN PATENTS

| | | |
|---|---|---|
| 848,477 | 9/1960 | Great Britain. |

RICHARD D. NEVIUS, *Primary Examiner.*

JACOB STEINBERG, JOSEPH B. SPENCER, *Examiners.*

A. GOLIAN, *Assistant Examiner.*